United States Patent
Nagase et al.

(10) Patent No.: US 9,631,777 B2
(45) Date of Patent: Apr. 25, 2017

(54) RAW MATERIAL VAPORIZING AND SUPPLYING APPARATUS EQUIPPED WITH RAW MATERIAL CONCENTRATION

(75) Inventors: Masaaki Nagase, Osaka (JP); Kaoru Hirata, Osaka (JP); Atushi Hidaka, Osaka (JP); Kouji Nishino, Osaka (JP); Nobukazu Ikeda, Osaka (JP); Takeshi Nakamura, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 444 days.

(21) Appl. No.: 14/343,226

(22) PCT Filed: Jul. 17, 2012

(86) PCT No.: PCT/JP2012/004559
§ 371 (c)(1),
(2), (4) Date: Jun. 18, 2014

(87) PCT Pub. No.: WO2013/035232
PCT Pub. Date: Mar. 14, 2013

(65) Prior Publication Data
US 2014/0299206 A1    Oct. 9, 2014

(30) Foreign Application Priority Data
Sep. 6, 2011   (JP) .................................. 2011-194285

(51) Int. Cl.
*F17D 3/00*   (2006.01)
*C23C 16/448*   (2006.01)
(Continued)

(52) U.S. Cl.
CPC ............ *F17D 3/00* (2013.01); *C23C 16/4482* (2013.01); *C23C 16/45561* (2013.01); *G05D 11/135* (2013.01); *Y10T 137/8158* (2015.04)

(58) Field of Classification Search
CPC ............................ F17D 3/00; Y10T 137/8158
(Continued)

(56) References Cited

U.S. PATENT DOCUMENTS

| 4,393,013 A | 7/1983 | McMenamin |
| 4,622,988 A | 11/1986 | Takimoto et al. |

(Continued)

FOREIGN PATENT DOCUMENTS

| JP | 02-255595 A | 10/1990 |
| JP | 5-102024 A | 4/1993 |

(Continued)

OTHER PUBLICATIONS

Office Action issued in co-pending related U.S. Appl. No. 14/075,740 on Jan. 6, 2016.
(Continued)

*Primary Examiner* — Craig Schneider
*Assistant Examiner* — Nicole Wentlandt
(74) *Attorney, Agent, or Firm* — Griffin and Szipl PC

(57) ABSTRACT

An apparatus able to regulate a raw material concentration, in a mixed gas of carrier gas and raw material gas, accurately and stably to supply the mixed gas to a process chamber, with a flow rate controlled highly accurately, thereby detecting a vapor concentration of the raw material gas in the mixed gas easily and highly accurately and displaying the concentration in real time without using an expensive concentration meter, etc.

16 Claims, 6 Drawing Sheets

(51) Int. Cl.
G05D 11/13 (2006.01)
C23C 16/455 (2006.01)

(58) Field of Classification Search
USPC ............... 137/334, 486, 468, 210, 487.5, 88
See application file for complete search history.

(56) References Cited

U.S. PATENT DOCUMENTS

| | | | |
|---|---|---|---|
| 4,787,254 | A | 11/1988 | Duckworth |
| 5,288,325 | A | 2/1994 | Gomi |
| 5,451,258 | A | 9/1995 | Hillman et al. |
| 5,669,408 | A | 9/1997 | Nishino et al. |
| 5,791,369 | A | 8/1998 | Nishino et al. |
| 5,816,285 | A | 10/1998 | Ohmi et al. |
| 5,865,205 | A | 2/1999 | Wilmer |
| 6,119,710 | A | 9/2000 | Brown |
| 6,205,409 | B1 | 3/2001 | Zvonar |
| 6,210,482 | B1 | 4/2001 | Kitayama et al. |
| 6,314,992 | B1 | 11/2001 | Ohmi et al. |
| 6,539,968 | B1 | 4/2003 | White et al. |
| 6,656,282 | B2 | 12/2003 | Kim et al. |
| 6,698,728 | B1 | 3/2004 | Ravetz et al. |
| 7,833,353 | B2 | 11/2010 | Furukawahara et al. |
| 2001/0013363 | A1 | 8/2001 | Kitayama et al. |
| 2002/0174898 | A1 | 11/2002 | Lowery et al. |
| 2003/0072875 | A1 | 4/2003 | Sandhu |
| 2004/0007180 | A1 | 1/2004 | Yamasaki et al. |
| 2004/0144178 | A1 | 7/2004 | Ohmi et al. |
| 2005/0173003 | A1 | 8/2005 | Laverdiere et al. |
| 2005/0221004 | A1 | 10/2005 | Kilpela et al. |
| 2006/0008328 | A1 | 1/2006 | Morgan et al. |
| 2007/0254093 | A1* | 11/2007 | Nijhawan ............ C23C 16/4482 427/8 |
| 2008/0009978 | A1 | 1/2008 | Smirnov |
| 2008/0220164 | A1 | 9/2008 | Bauch et al. |
| 2009/0095068 | A1 | 4/2009 | Redemann et al. |
| 2009/0214779 | A1 | 8/2009 | Sarigiannis et al. |
| 2009/0326719 | A1 | 12/2009 | Nagase et al. |
| 2010/0012026 | A1 | 1/2010 | Hirata et al. |
| 2010/0108154 | A1* | 5/2010 | Minami ................ G05D 11/132 137/88 |
| 2010/0139775 | A1 | 6/2010 | Ohmi et al. |
| 2010/0178423 | A1 | 7/2010 | Shimizu et al. |
| 2010/0192854 | A1 | 8/2010 | Nishino et al. |
| 2010/0304567 | A1 | 12/2010 | Sakai et al. |
| 2011/0100483 | A1 | 5/2011 | Nagata et al. |
| 2011/0108126 | A1 | 5/2011 | Monkowski et al. |
| 2011/0265895 | A1 | 11/2011 | Okabe |

FOREIGN PATENT DOCUMENTS

| | | |
|---|---|---|
| JP | 06-104155 A | 4/1994 |
| JP | 07-118862 A | 5/1995 |
| JP | 2000-066732 A | 3/2000 |
| JP | 2000-282242 A | 10/2000 |
| JP | 2000-323464 A | 11/2000 |
| JP | 2001-313288 A | 11/2001 |
| JP | 3291161 B2 | 6/2002 |
| JP | 2002-543589 A | 12/2002 |
| JP | 2003-013233 A | 1/2003 |
| JP | 2003-286573 A | 10/2003 |
| JP | 2003-323217 A | 11/2003 |
| JP | 2004-091917 A | 3/2004 |
| JP | 2004-246826 A | 9/2004 |
| JP | 2004-256864 A | 9/2004 |
| JP | 2005-149075 A | 6/2005 |
| JP | 2006-038832 A | 2/2006 |
| JP | 2007-095042 A | 4/2007 |
| JP | 2007-250803 A | 9/2007 |
| JP | 2008-010510 A | 1/2008 |
| JP | 4137666 B2 | 6/2008 |
| JP | 2009-059871 A | 3/2009 |
| JP | 2009-076807 A | 4/2009 |
| JP | 2009-226408 A | 10/2009 |
| JP | 2009-252760 A | 10/2009 |
| JP | 2010-153741 A | 7/2010 |
| JP | 2011-006782 A | 1/2011 |
| JP | 4605790 B2 | 1/2011 |
| JP | 2011-137235 A | 7/2011 |
| JP | 2001-258184 A | 9/2011 |
| WO | 00/65649 A1 | 11/2000 |
| WO | 01/42539 A1 | 6/2001 |
| WO | 2009/122646 A1 | 10/2009 |

OTHER PUBLICATIONS

Office Action issued in co-pending related U.S. Appl. No. 14/075,890 on Jan. 6, 2016.
Office Action issued in co-pending related U.S. Appl. No. 14/170,953 on May 13, 2016.
Office Action issued in co-pending related U.S. Appl. No. 14/065,078 on Aug. 27, 2015.
Office Action issued in co-pending related U.S. Appl. No. 14/150,263 on Jun. 16, 2015.
International Search Report issued in application PCT/JP2012/001117, completed Apr. 2, 2012 and mailed Apr. 17, 2012.
http://www.massflow-online.com/faqs/what-do-Inmin-Ismin-slm-and-sccm-stand-for/ (2012)(downloaded Sep. 11, 2013).
English translation of the International Preliminary Report on Patentability issued in application PCT/JP2012/001117, mailed Apr. 17, 2012.
International Search Report issued in application PCT/JP2012/002395 completed Apr. 20, 2012 and mailed May 1, 2012.
English translation of the International Preliminary Report on Patentability issued in application PCT/JP2012/002395, on Nov. 13, 2013.
International Search Report issued in application PCT/JP2012/002394 completed Apr. 20, 2012 and mailed May 1, 2012.
English translation of the International Preliminary Report on Patentability issued in application PCT/JP2012/002394, on Nov. 13, 2013.
International Search Report issued in application PCT/JP2012/002832, completed Sep. 21, 2012 and mailed Oct. 2, 2012.
English translation of the International Preliminary Report on Patentability issued in application PCT/JP2012/002832 on Jan. 14, 2014.
"Standard Cubic Centimeters Per Minute," at http://www.al-lacronyms.com/SCCMstandard_cubic_centimeters_per_minute/213202 (downloaded Nov. 14, 2013).
"Tetraethyl Orthosilicate" (Air Products and Chemicals, Inc. 2012).
International Search Report issued in application PCT/JP2012/003783, completed Jul. 31, 2012 and mailed Aug. 7, 2012.
English translation of the International Preliminary Report on Patentability issued in application PCT/JP2012/003783, on Feb. 4, 2014.
International Search Report issued in application PCT/JP2012/004559, completed Aug. 6, 2012 and mailed Aug. 14, 2012.
Final Office Action issued in co-pending related U.S. Appl. No. 14/150,263 on Nov. 17, 2015.
Office Action issued in co-pending U.S. Appl. No. 14/065,078 on Nov. 14, 2016.
Office action issued Sep. 6, 2016 in co-pending related U.S. Appl. No. 14/170,953.
Office Action issued in co-pending related U.S. Appl. No. 14/170,953 on Mar. 1, 2017.

* cited by examiner

PRIOR ART

PRIOR ART

RAW MATERIAL VAPORIZING AND SUPPLYING APPARATUS EQUIPPED WITH RAW MATERIAL CONCENTRATION

This is a National Phase Application in the United States of International Patent Application No. PCT/JP2012/004559 filed Jul. 17, 2012, which claims priority on Japanese Patent Application No. 2011-194285, filed Sep. 6, 2011. The entire disclosures of the above patent applications are hereby incorporated by reference.

BACKGROUND OF THE INVENTION

Technical Field

The present invention relates to an improvement in a raw material vaporizing and supplying apparatus for semiconductor manufacturing equipment using so-called metalorganic chemical vapor deposition (hereinafter, referred to as MOCVD), and, also, to a raw material vaporizing and supplying apparatus equipped with a raw material concentration detection mechanism, capable of controlling a raw material concentration of a raw material mixed gas supplied to a process chamber highly accurately and quickly, and also capable of displaying the raw material gas concentration in real time.

Description of the Related Art

Conventionally, as this type of raw material vaporizing and supplying apparatus for semiconductor manufacturing equipment, a raw material vaporizing and supplying apparatus which utilized a so-called bubbling method has been used in many applications. In vaporizing and supplying of a raw material according to the bubbling method, there has been a strong demand for, such as, realizing significant downsizing of the raw material vaporizing and supplying apparatus, an increased supply quantity of a raw material, quick and highly accurate control of a mixture ratio of carrier gas and raw material gas, and direct display of a raw material gas concentration in the mixed gas supplied to a chamber.

Therefore, various types of research and development have been made for the bubbling-type raw material vaporizing and supplying apparatus. For example, techniques in the fields of controlling a flow rate of a mixed gas supplied to a process chamber and a raw material gas concentration in the mixed gas are disclosed in Japanese Published Unexamined Patent Application Publication No. H07-118862, Japanese Patent No. 4605790, etc.

FIG. 6 is a drawing that describes the structure of a reaction gas control method described in Japanese Published Unexamined Patent Application Publication No. H07-118862 given above. In FIG. 6, reference numeral 31 denotes a closed tank, 32 denotes a heater, 33 denotes a mass flow controller, 34 denotes an injection pipe, 35 denotes an ejection pipe, 36 denotes a mass flow meter, $L_0$ denotes a liquid raw material (TEOS, or tetraethyl orthosilicate), $G_K$ denotes a carrier gas ($N_2$), $G_m$ denotes a mixed gas ($G+G_K$), G denotes a raw material gas, $Q_1$ denotes a carrier gas flow rate, $Q_2$ denotes a raw material gas flow rate, $Q_S$ denotes a mixed gas flow rate, 37 denotes a flow rate setting circuit, 38a denotes a concentration calculation circuit, 38b denotes a concentration setting circuit, 38c denotes an electric current control circuit, $Q_{S0}$ denotes a set flow rate, and $K_{S0}$ denotes a set concentration.

The present invention is to control a temperature of the liquid raw material L0, thereby regulating a produced flow rate $Q_2$ of a raw material gas G to keep the concentration of the raw material gas G in a mixed gas $G_m$ constant. More specifically, computation is made for the produced flow rate $Q_2$ of the raw material gas with reference to a mixed gas flow rate $Q_S$ from the mass flow meter 36 and a carrier gas flow rate $Q_1$ from the mass flow controller 33.

Further, the thus computed $Q_2$ (the produced flow rate of the raw material gas) is used to determine $Q_2/Q_S$, thereby computing a raw material gas concentration $K_S$ in the mixed gas $G_m$.

The thus computed raw material gas concentration $K_S$ is input into the concentration setting circuit 38b and by comparing with a set concentration $K_{S0}$, a difference between them ($K_{S0}-K_S$) is subjected to feedback to the electric current control circuit 38c. Where such a relationship of $K_{S0}>K_S$ is obtained, the heater 32 is operated so as to raise its temperature, thereby increasing the produced flow rate $Q_2$ of the raw material gas G. Where such a relationship of $K_{S0}<K_S$ is obtained, the heater is operated so as to lower its temperature, thereby decreasing the produced flow rate $Q_2$.

Further, the mixed gas flow rate $Q_S$ from the mass flow meter 36 is compared with the set mixed gas flow rate $Q_{S0}$ on the flow rate setting circuit 37, thereby regulating the flow rate $Q_1$ from a mass flow controller so that a difference between them becomes zero.

However, the method for regulating the raw material gas concentration as shown in FIG. 6 increases the produced flow rate $Q_2$ of a raw material gas by heating the liquid raw material $L_0$, (or decreases the produced flow rate $Q_2$ of the raw material gas by lowering a temperature of the liquid raw material $L_0$). Therefore, there is a problem that the method is very low in response characteristics with respect to regulation of concentration and extremely low in response characteristics with respect to a decrease in concentration of the raw material gas.

Further, the mass flow meter (thermo-flowmeter) 36 undergoes a great fluctuation in measured flow rate value when a type of mixed gas $G_m$ or a mixture ratio thereof is changed. Therefore, the method shown in FIG. 6 has such a problem that, irrespective of whether a type of mixed gas $G_m$ is changed or the type is the same, a great change in a mixture ratio (concentration of raw material gas) will result in a drastic decrease in the measuring accuracy of a flow rate $Q_S$.

Still further, the change in temperature of heating the liquid raw material $L_0$ will raise a pressure inside the closed tank 31, thereby inevitably resulting in a fluctuation in primary side pressure of the mass flow meter 36. As a result, the mass flow meter 36 will have an error in the measured flow rate value, thus revealing a problem of decreasing the control accuracy of a flow rate and concentration of raw material gas.

On the other hand, FIG. 7 is a drawing which shows the structure of a raw material gas supplying apparatus of Patent No. 4605790 which has been described above. The apparatus is able to supply a mixed gas having a predetermined concentration of raw material gas to a process chamber, with a flow rate thereof being controlled highly accurately with high responsive characteristics.

In FIG. 7, reference numeral 21 denotes a closed tank, 22 denotes a constant temperature device, 23 denotes a mass flow controller, 24 denotes an injection pipe, 25 denotes an ejection pipe, 26 denotes an automatic pressure regulator for the closed tank, 26a denotes an arithmetic and control unit, 26b denotes a control valve, $L_0$ denotes a liquid raw material, $G_K$ denotes a carrier gas, $Q_1$ denotes a carrier gas flow rate, G denotes a raw material gas, $G_m$ denotes a mixed gas ($G+G_K$), and $Q_S$ denotes a mixed gas flow rate.

In the raw material gas supplying apparatus, first, the constant temperature device 22 is used to heat the closed tank 21, a main body of the automatic pressure regulator 26 for the closed tank and a piping line L to a predetermined temperature. Thereby, an internal space of the closed tank 21 is filled with saturated steam (raw material gas) G of a raw material.

Further, the carrier gas $G_K$ at a flow rate $Q_1$ controlled by the mass flow controller 23 is released from a bottom of the closed tank 21. A mixed gas $G_m$ of the carrier gas $G_K$ and the saturated steam (or vapor) G of the raw material is supplied through the control valve 26b of the automatic pressure regulating device 26 to outside (process chamber).

The mixed gas $G_m$ is regulated for the flow rate $Q_S$ by controlling a pressure of the mixed gas in the closed tank 21 by the automatic pressure regulator 26. A set flow rate $Q_{S0}$ is compared with a computation flow rate $Q_S$ computed with reference to measurement values obtained from a pressure gauge $P_0$ and a temperature gauge $T_0$ at an arithmetic and control unit 26a of the automatic pressure regulator 26. And, the control valve 26b is opened and closed so that a difference between them ($Q_{S0}$-$Q_S$) becomes zero, thereby controlling a flow rate $Q_S$ of supplying the mixed gas $G_m$ to a set flow rate $Q_{S0}$.

The raw material gas supplying apparatus shown in FIG. 7 is able to supply the mixed gas $G_m$ having a constant raw material gas concentration which is determined in response to a heating temperature of the liquid raw material $L_0$ by regulating an internal pressure of the closed tank, with a flow rate thereof controlled highly accurately with high response characteristics, thereby providing excellent effects of controlling a flow rate of the mixed gas having a predetermined and constant raw material gas concentration.

Although the raw material gas supplying apparatus is able to measure a flow rate $Q_S$ of the mixed gas $G_m$ highly accurately and with high response characteristics, it has a basic problem that the mixed gas $G_m$ is not measured for a raw material gas concentration highly accurately and cannot display a measurement value thereof. As a matter of course, if a heating temperature of the closed tank 21, a flow rate of the carrier gas $G_K$, a level height of the raw material liquid $L_0$, etc., are determined, it is possible to estimate a raw material gas concentration $K_S$ in the mixed gas $G_m$ to some extent. However, a technique has not yet been developed that a raw material gas concentration of the mixed gas $G_m$ supplied to a process chamber can be continuously and automatically measured and displayed without using a complicated and expensive concentration meter, etc., in a less expensive and economical manner.

CITATION LIST

Patent Document

Patent Document 1: Japanese Published Unexamined Patent Application Publication No. H07-118862
Patent Document 2: Japanese Patent No. 4605790

SUMMARY OF THE INVENTION

Problems to be Solved by the Invention

The main object of the present invention is to solve problems of the raw material vaporizing and supplying apparatus described in Japanese Published Unexamined Patent Application Publication No. H07-118862 and Japanese Patent No. 4605790. That is, the former case has the following problems, for example. (A) The raw material vaporizing and supplying apparatus is increased or (decreased) in produced flow rate Q of a raw material gas by heating or cooling a liquid raw material $L_0$, thereby regulating a raw material gas concentration $K_S$ in a mixed gas $G_m$. Thus, the apparatus is relatively low in response characteristics for controlling the raw material gas concentration and also required to have expensive additional equipment for increasing the response characteristics. Thereby, the raw material gas supplying apparatus has increased manufacturing costs and dimensions. (B) Where the mixed gas $G_m$ is changed in the type of mixed gas or the mixture ratio thereof, the mass flow meter undergoes a great fluctuation in the measured flow rate value. Then, a mixed gas flow rate $Q_S$ is decreased in accuracy of measurement, resulting in a great decrease in accuracy of computing the raw material gas concentration $K_S$. (C) Change in heating temperature will result in a fluctuation in pressure in the closed tank 31. Thereby, the mass flow meter 35 has decreased accuracy of measurement to decrease the accuracy of computing a measurement value of the flow rate $Q_S$ and the raw material concentration $K_S$. Further, the latter case has the following problem, for example. (A) It is not possible to measure a raw material gas concentration in the mixed gas $G_m$ highly accurately and display the concentration in real time. Therefore, the present invention seeks to provide a raw material vaporizing and supplying apparatus equipped with a raw material concentration detection mechanism in which the raw material gas concentration $K_S$ in a mixed gas $G_m$ of carrier gas $G_K$ and raw material gas G supplied to a process chamber is measured and displayed continuously and automatically Furthermore, in place of a concentration meter, etc., high in cost and complicated in structure, a device low in cost and simple in structure can be used for extremely economical control and display of the raw material gas concentration in the mixed gas $G_m$.

Means for Solving the Problems

The invention according to the first aspect is a raw material vaporizing and supplying apparatus which supplies a carrier gas $G_K$ into a source tank 5 through a mass flow controller 3 to release the carrier gas $G_K$ from inside the source tank 5 and also supplies into a process chamber a mixed gas $G_S$ composed of the carrier gas $G_K$ and saturated steam G of a raw material 4 produced by keeping the source tank 5 at a constant temperature by a constant temperature unit 6, and the raw material vaporizing and supplying apparatus in which an automatic pressure regulating device 8 and a mass flow meter 9 are installed on a flow-out passage of the mixed gas $G_S$ from the source tank 5, the automatic pressure regulating device 8 is controlled so as to open and close a control valve 8a, thereby controlling an internal pressure $P_0$ of the source tank 5 to a predetermined value, individual detection values of a flow rate $Q_1$ of the carrier gas $G_K$ by the mass flow controller 3, the internal pressure $P_0$ of the tank and a flow rate $Q_S$ of the mixed gas $G_S$ by the mass flow meter 9 are input into a raw material concentration arithmetic unit 10, the raw material concentration arithmetic unit 10 is used to compute a raw material flow rate $Q_2$ based on $Q_2 = Q_S \times P_{M0}/P_0$ (however, $P_{M0}$ is a saturated steam pressure of the raw material steam G at a temperature of t° C. in the source tank), and a raw material concentration K of the mixed gas $G_S$ supplied to the process chamber is computed and displayed in terms of $K = Q_2/Q_S$ with reference to the raw material flow rate $Q_2$.

The invention according to the second aspect is the invention according to the first aspect, in which a storage device of saturated steam pressure data of the raw material in the source tank 5 is installed on the raw material concentration arithmetic unit 10 and also detection signals of an internal pressure $P_0$ of the source tank 5 and a temperature t from the automatic pressure regulating device 8 are input into the raw material concentration arithmetic unit 10.

The invention according to the third aspect is a raw material vaporizing and supplying apparatus which supplies a carrier gas $G_K$ into a source tank 5 through a mass flow controller 3 to release the carrier gas $G_K$ from inside the source tank 5 and also supplies to a process chamber a mixed gas $G_S$ composed of the carrier gas $G_K$ and saturated steam G of a raw material 4 produced by keeping the source tank 5 at a constant temperature by a constant temperature unit 6, and the raw material vaporizing and supplying apparatus in which an automatic pressure regulating device 8 and a mass flow meter 9 are installed on a flow-out passage of the mixed gas $G_S$ from the source tank 5, the automatic pressure regulating device 8 is controlled so as to open and close a control valve 8a, thereby controlling an internal pressure $P_0$ of the source tank 5 to a predetermined value, individual detection values of a flow rate $Q_1$ of the carrier gas $G_K$ by the mass flow controller 3, the internal pressure $P_0$ of the tank and a flow rate $Q_S$ of the mixed gas $G_S$ from the mass flow meter 9 are input into a raw material concentration arithmetic unit 10, and the raw material concentration arithmetic unit 10 is used to determine a raw material flow rate $Q_2$ based on $Q_2 = CF \times Q_S' - Q_1$ (however, CF is a conversion factor of the mixed gas $Q_2$), and a raw material concentration K of the mixed gas $G_S$ supplied to the process chamber is computed and displayed based on $K = Q_2/(Q_1 + Q_2)$ with reference to the raw material flow rate $Q_2$.

The invention according to the fourth aspect is the invention according to the third aspect, in which a conversion factor CF of the mixed gas $Q_S$ is given as $1/CF = C/CF_A + (1-C)/CF_B$ (however, $CF_A$ is a conversion factor of the carrier gas $G_K$, $CF_B$ is a conversion factor of the raw material gas G, and C is a volume ratio of carrier gas $(Q_1/(Q_1+Q_2))$).

The invention according to the fifth aspect is the invention according to the first aspect or the third aspect, in which the raw material concentration detection unit 10, a flow rate arithmetic and control unit 3b of the mass flow controller 3, a pressure arithmetic and control unit 8b of the automatic control device and a flow rate arithmetic and control unit 9b of the mass flow meter 9 are arranged so as to be assembled in an integrated manner.

The invention according to the sixth aspect is the invention according to the third aspect, in which the raw material concentration arithmetic unit 10 is provided with a storage device of individual data on conversion factors of the raw material gas G in the source tank and conversion factors of the carrier gas $G_K$.

The invention according to the seventh aspect is the invention according to any one of the first aspect to the sixth aspect, in which the mass flow meter 9 is installed on the downstream side of the automatic pressure regulating device 8.

The invention according to the eighth aspect is the invention according to any one of the first aspect to the sixth aspect, in which the mass flow meter 9 is installed on the upstream side of the automatic pressure regulating device 8.

The invention according to the ninth aspect is the invention according to any one of the first aspect to the sixth aspect, in which the automatic pressure regulating device 8 is a pressure regulating device which has a temperature detector T, a pressure detector P, a control valve 8a installed on the downstream side from the pressure detector P and a pressure arithmetic and control unit 8b.

The invention according to the tenth aspect is an invention in which the mass flow meter 9 is installed between the pressure detector P and the control valve 8a.

In the present invention, the raw material vaporizing and supplying apparatus is arranged so that a flow rate $Q_1$ of supplying the carrier gas $G_K$ from the mass flow controller 3, a flow rate $Q_S$ of supplying the mixed gas $G_S$ from the mass flow meter 9 and an internal pressure of the tank from the automatic pressure regulating device 8 in the source tank, etc., are input into the raw material concentration arithmetic unit 10, and the mixed gas $G_S$ is supplied to the chamber at a constant pressure and, at the same time, a raw material gas concentration K in the thus supplied mixed gas $G_S$ is computed and displayed on the raw material concentration arithmetic unit 10 in real time. Therefore, the mixed gas $G_S$ can be supplied at a more stable raw material concentration K. It is also possible to display the raw material concentration K of the mixed gas $G_S$ in a digital form and carry out stable process treatment which is high in quality.

Further, it is acceptable that the raw material concentration arithmetic unit 10 is simply added. Thereby, as compared with a case where the above-described expensive gas concentration meter is used, the raw material gas concentration K in the mixed gas $G_S$ can be detected and displayed reliably and in a less-expensive manner.

DETAILED DESCRIPTION OF THE PREFERRED EMBODIMENTS

Hereinafter, an embodiment of the present invention will be described with reference to the drawings.

Figure 1:
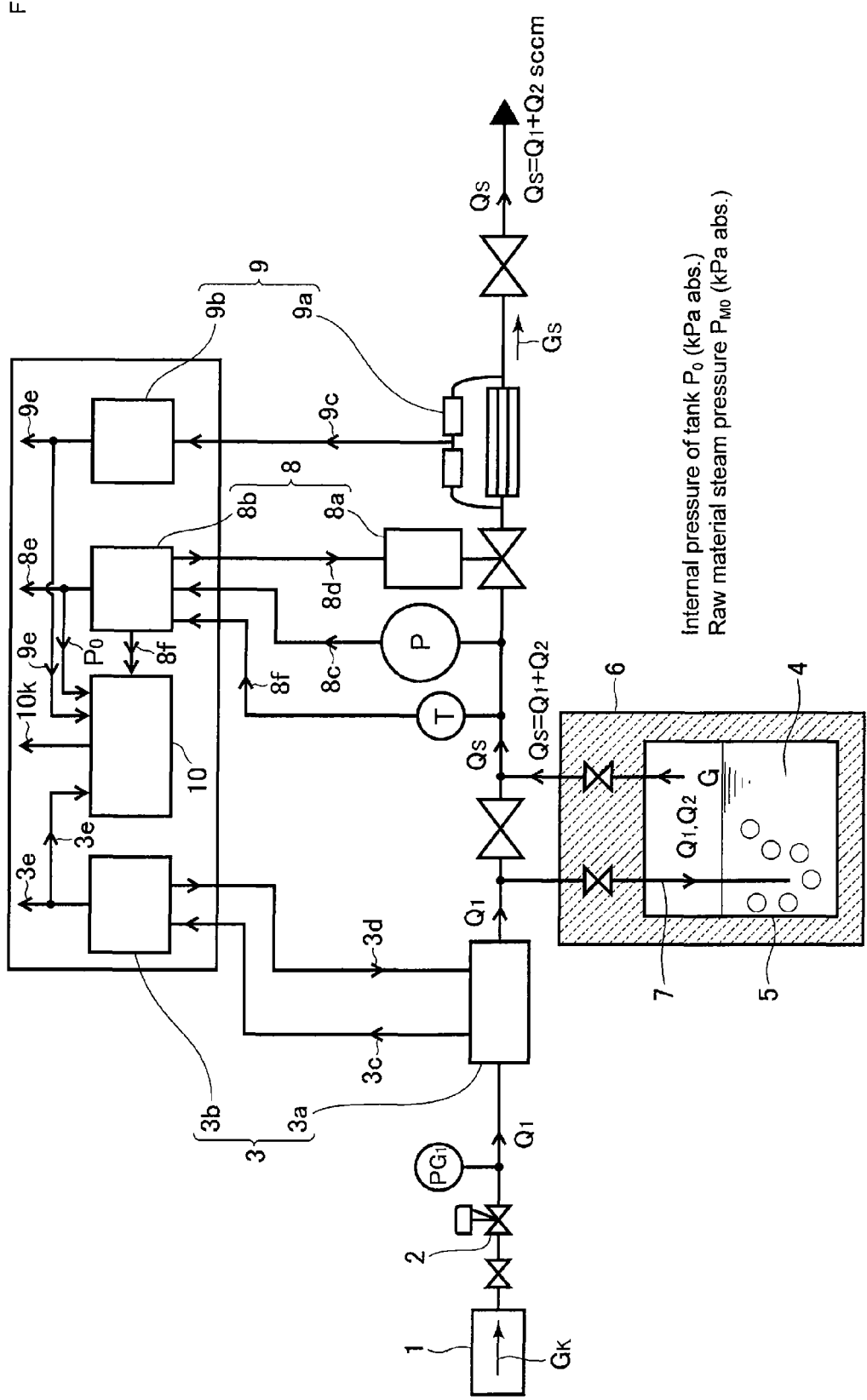
FIG. 1 is a systematic diagram which shows the structure of a raw material vaporizing and supplying apparatus equipped with a raw material concentration detection mechanism according to a first embodiment of the present invention.

FIG. 1 is a systematic diagram which shows the structure of a raw material vaporizing and supplying apparatus equipped with a raw material concentration detection mechanism according to the first embodiment of the present invention.

In FIG. 1, reference numeral 1 denotes a carrier gas supply source, 2 denotes a decompression unit, 3 denotes a thermal type mass flow control system (mass flow controller), 4 denotes a raw material (organometallic compound (MO material), etc.), 5 denotes a source tank, 6 denotes a constant temperature unit, 7 denotes an induction pipe, 8 denotes an automatic pressure regulating device in the source tank, 9 denotes a mass flow meter, 10 denotes a raw material concentration arithmetic unit, $Q_1$ denotes a carrier gas flow rate of Ar, etc., $Q_2$ denotes a flow rate of the raw material saturated steam (raw material gas flow rate), $Q_S$ denotes a mixed gas flow rate of the carrier gas flow rate $Q_1$ and the raw material steam flow rate $Q_2$, P denotes a pressure detector of the mixed gas $G_S$, T denotes a temperature detector of the mixed gas $G_S$, 3a denotes a sensor unit of the mass flow controller, 8a denotes a piezoelectric element driving control valve, 9a denotes a sensor unit of the mass flow meter, and 9b denotes an arithmetic and control unit of the mass flow meter 9a. The mass flow controller 3 is made up of the sensor unit 3a and a flow rate arithmetic and control unit 3b of the sensor unit 3a. The automatic pressure regulator 8 of the source tank is made up of the control valve 8a, a pressure arithmetic and control unit 8b, the pressure detector P and the temperature detector T.

It is noted that $N_2$ is generally used as the carrier gas $G_K$. However, the carrier gas $G_K$ is not limited to $N_2$ but includes various types of gas such as $H_2$ and Ar. Further, the raw material includes an organometallic compound (MO material) but shall not be limited to an organometallic material. The raw material also includes any liquid and solid materials as long as they are capable of attaining a predetermined saturated steam pressure in a source tank.

The mass flow controller 3 is publicly known and, therefore, a detailed description thereof will be omitted here. The automatic pressure regulating device 8 of the source tank is also publicly known in Japanese Patent No. 4605790, etc., with a detailed description thereof omitted here.

Further, in FIG. 1, reference numeral $G_K$ denotes a carrier gas, G denotes raw material steam (raw material gas), $G_S$ denotes a mixed gas, $P_0$ denotes an internal pressure of the source tank (kPa abs.), $P_{M0}$ denotes a raw material steam pressure in the source tank (kPa abs.), 3e denotes a flow rate display signal, 8d denotes a control valve control signal, 8c denotes a pressure detection signal, 8f denotes a temperature detection signal, 8e denotes a pressure display signal, 9c denotes a mixed gas flow rate detection signal, and 9e denotes a mixed gas flow rate display signal. The display signal 3e of the flow rate $Q_1$ of the carrier gas $G_K$ and the display signal 9e of the flow rate $Q_S$ of the mixed gas $G_S$ from the mass flow meter 9 are input into the raw material concentration arithmetic unit 10, and a raw material gas concentration K in the mixed gas $G_S$ is computed and displayed here. It is noted that $10_K$ denotes a raw material concentration display signal.

It is noted that in the embodiment shown in FIG. 1, the flow rate arithmetic and control unit 3b of the mass flow controller 3, the pressure arithmetic and control unit 8b of the automatic pressure regulating device 8, the flow rate arithmetic and control unit 9b of the mass flow meter 9 and the raw material concentration arithmetic unit 10 are formed on a single substrate in an integrated manner. As a matter of course, it is also acceptable that the control units 3b, 8b, 9b and the raw material concentration arithmetic unit 10 are individually installed.

Next, a description will be given of operation of the raw material vaporizing and supplying apparatus.

In the raw material vaporizing and supplying apparatus, first, a pressure $PG_1$ of the carrier gas $G_K$ supplied into the source tank 5 is set so as to give a predetermined pressure value by the decompression unit 2 and a supplying flow rate $Q_1$ thereof is also set so as to give a predetermined value by the thermal type mass flow control system 3 (mass flow controller).

Further, the constant temperature unit 6 is operated to keep parts in constant temperature excluding the source tank 5, the arithmetic and control unit 8b of the automatic pressure regulating device 8, etc.

As described so far, the supply quantity $Q_1$ of the carrier gas $G_K$ is kept at a set value by the thermal type mass flow control system 3, the temperature of the source tank 5 is kept at a set value, and the internal pressure $P_0$ of the source tank 5 is kept at a set value by the automatic pressure regulating device 8, respectively. Thereby, the mixed gas $G_S$ with a constant flow rate is allowed to flow into the mass flow meter 9 at a fixed mixture ratio through the control valve 8a, and the flow rate $Q_S$ of the mixed gas $G_S$ is measured here with high accuracy.

Further, the source tank 5, the control valve 8a of the automatic pressure regulating device 8, etc., are kept at constant temperature. Therefore, a pressure $P_{M0}$ of the raw material saturated steam G in the source tank 5 is kept stable and the internal pressure $P_0$ of the source tank 5 is controlled so as to give a set value by the automatic pressure regulating device 8. It is, thereby, possible to measure and display the raw material gas concentration K in the mixed gas $G_S$ on the raw material concentration arithmetic unit 10 as described later, while the concentration K of the raw material gas G in the mixed gas $G_S$ is kept stable.

And, in the raw material vaporizing and supplying apparatus shown in FIG. 1, where the internal pressure of the source tank is given as $P_0$ (kPa abs.), the raw material steam pressure is given as $P_{M0}$, the flow rate of the carrier gas $G_K$, is given as $Q_1$ (sccm), the flow rate of the mixed gas $G_S$ supplied to the chamber is given as $Q_2$ (sccm) and the flow rate of the raw material steam G is given as $Q_2$ (sccm), the flow rate $Q_S$ of supplying the mixed gas $G_S$ to the chamber is expressed as $Q_S=Q_1+Q_2$ (sccm).

That is, the raw material flow rate $Q_2$ is proportional to the raw material steam pressure $P_{M0}$ in the source tank, and the flow rate of supplying the mixed gas $G_S$, that is, $Q_S=Q_1+Q_2$, is proportional to the internal pressure $P_0$ of the source tank. Therefore, the following relationship is obtained. Raw material flow rate $Q_2$: mixed gas supplying flow rate $Q_S$=raw material steam pressure $P_{M0}$: internal pressure $P_0$ of source tank.

That is,

[Formula 1]

$$Q_2 \times P_0 = Q_S \times P_{M0} \quad (1)$$

With reference to Formula 1, the raw material flow rate $Q_2$ is expressed as follows:

[Formula 2]

$$Q_2 = Q_S \times P_{M0}/P_0 \quad (2)$$

As apparent from Formula 2 given above, the raw material flow rate $Q_2$ is determined by the mixed gas flow rate $Q_S$, the source tank pressure $P_0$ and the raw material steam pressure (partial pressure) $P_{MO}$. Further, the internal pressure $P_0$ of source tank is determined by the temperature t in the source tank.

In other words, the raw material concentration K in the mixed gas $G_S$ is determined by parameters such as the carrier gas flow rate $Q_1$, the internal pressure $P_0$ of source tank and the temperature t in the source tank.

In FIG. 1, the mass flow meter 9 is installed on the downstream side of the automatic pressure regulating device 8. It is acceptable that their positions are exchanged so that the automatic pressure regulating device 8 is installed on the downstream side of the mass flow meter 9. It is also acceptable that the mass flow meter 9 is installed between the pressure detector P and the control valve 8a.

As shown in FIG. 1, where the automatic pressure regulating device 8 is installed on the upstream side of the mass flow meter 9, a control pressure of the automatic pressure regulating device 8 is in agreement with an internal pressure of the source tank. It is, therefore, possible to control the internal pressure of the source tank accurately. However, such a problem is posed that a supply pressure of the mass flow meter 9 is influenced by a secondary side (process chamber side).

On the other hand, where the mass flow meter 9 is installed on the upstream side of the automatic pressure regulating device 8, the mass flow meter 9 is in a range of pressure control by the automatic pressure regulating device 8. Thus, the mass flow meter 9 is made stable in supply pressure, thus enabling highly accurate measurement of a flow rate. However, the mass flow meter 9 undergoes pressure loss, thereby causing a difference between the control pressure of the automatic pressure regulating device 8 and the internal pressure of the source tank.

Further, where the mass flow meter 9 is installed between the pressure detector P and the control valve 8a, the control pressure of the automatic pressure regulating device 8 is in agreement with the internal pressure of the source tank and the mass flow meter 9 is also in a range of pressure controlled by the automatic pressure regulating device 8. Therefore, the mass flow meter 9 is made stable in supply pressure, enabling highly accurate measurement of a flow rate. However, such a problem is posed that the mass flow meter 9 causes pressure loss between the pressure detector P and the control valve 8a, thereby affecting the response characteristics for pressure control.

Figure 2:
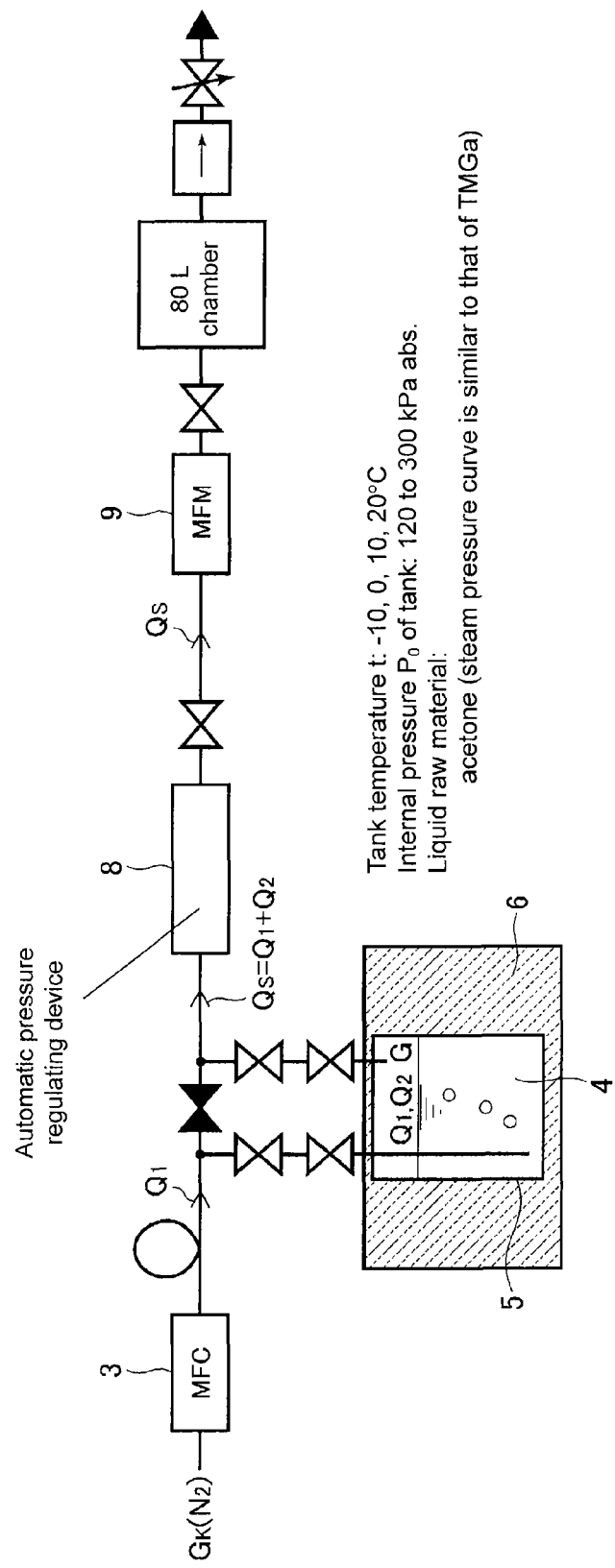
FIG. 2 is a drawing which describes test equipment used for studying a relationship between a raw material gas flow rate $Q_2$, a mixed gas flow rate $Q_S$, a carrier gas flow rate $Q_1$, a source tank pressure $P_0$ and a source tank temperature t.

FIG. 2 is a drawing which describes test equipment used for confirming the establishment of a relationship between Formula 1 and Formula 2 given above. Acetone (steam pressure curve is close to that of TMGa) was used as the raw material 4, a water bath was used as the constant temperature unit 6 and $N_2$ was used as the carrier gas $G_K$. A relationship between the internal pressure $P_0$ of the tank and the flow rate $Q_S$ of the mixed gas $G_S$ was regulated, with the tank temperature t given as a parameter (−10° C., 0° C., 10° C., 20° C.).

Figure 3:
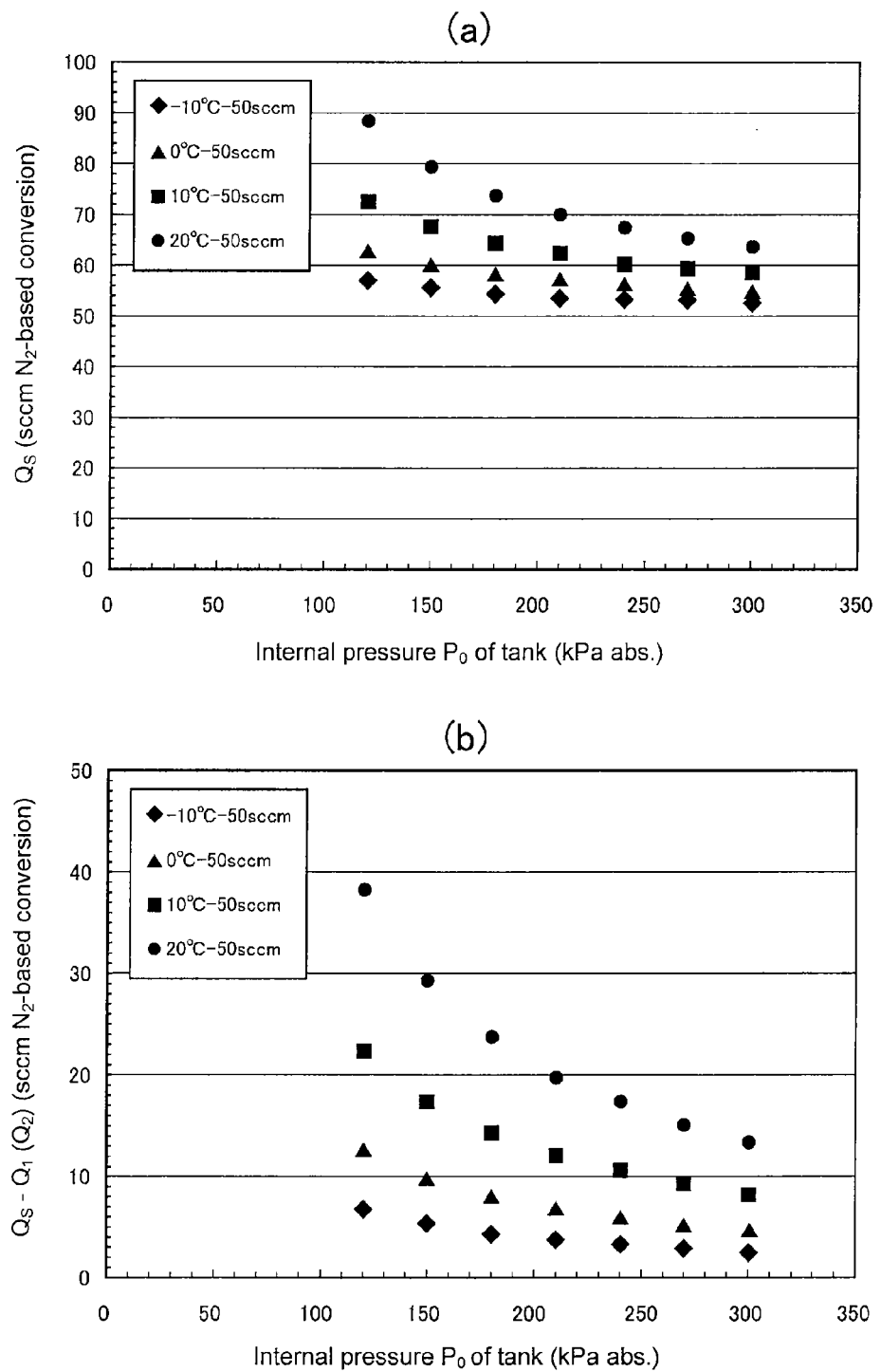
FIG. 3 is a drawing which shows a relationship between the internal pressure $P_0$ of the tank, the mixed gas flow rate $Q_S$, the raw material gas flow rate $Q_2$ and the tank temperature t measured by using the test equipment given in FIG. 2, in which (a) shows a state of change in the mixed gas flow rate $Q_S$ and (b) shows a state of change in the raw material gas flow rate $Q_2$.

FIG. 3 shows results of the test carried out by using the test equipment of FIG. 2. Further, Table 1 below shows results obtained by using Formula 2 to compute the raw material gas flow rate $Q_2$ of the raw material acetone.

TABLE 1

Raw material acetone: Carrier gas $N_2$ (50 sccm)

| Temperature of constant temperature water bath (° C.) | | Internal pressure $P_0$ of tank (kPa abs) and raw material flow rate Q (sccm) | | | | | | |
|---|---|---|---|---|---|---|---|---|
| Setting | Measurement | 120 | 150 | 180 | 210 | 240 | 270 | 300 |
| 20 | 19.4 | 12.43 | 9.56 | 7.70 | 6.44 | 5.59 | 4.92 | 4.36 |
| 10 | 9.8 | 7.34 | 5.68 | 4.67 | 3.94 | 3.42 | 3.02 | 2.69 |
| 0 | −0.5 | 4.12 | 3.25 | 2.67 | 2.27 | 1.99 | 1.77 | 1.57 |
| −10 | −11.0 | 2.21 | 1.74 | 1.44 | 1.23 | 1.08 | 0.96 | 0.86 |

Table 2 shows comparison between steam pressure of acetone as a raw material and steam pressure of TMGa (trimethyl gallium) as a generally-used MO material. Since these two substances are remarkably approximate in steam pressure, calculation values obtained by using acetone in Table 1 can be said to indicate those of TMGa used as a raw material.

TABLE 2

| | kPa | Torr |
|---|---|---|
| Steam pressure of acetone | | |
| −10 | 5.39 | 40.4 |
| 0 | 9.36 | 70.2 |
| 10 | 15.53 | 116.5 |
| 20 | 24.74 | 185.6 |
| 30 | 38.03 | 285.3 |
| 40 | 56.64 | 424.9 |
| 50 | 81.98 | 615.1 |
| Steam pressure of TMGa | | |
| −10 | 5.20 | 39.0 |
| 0 | 8.97 | 67.3 |
| 10 | 14.91 | 111.8 |
| 20 | 23.92 | 179.4 |
| 30 | 37.21 | 279.1 |
| 40 | 56.26 | 422.0 |
| 50 | 82.93 | 622.0 |

Figure 4:
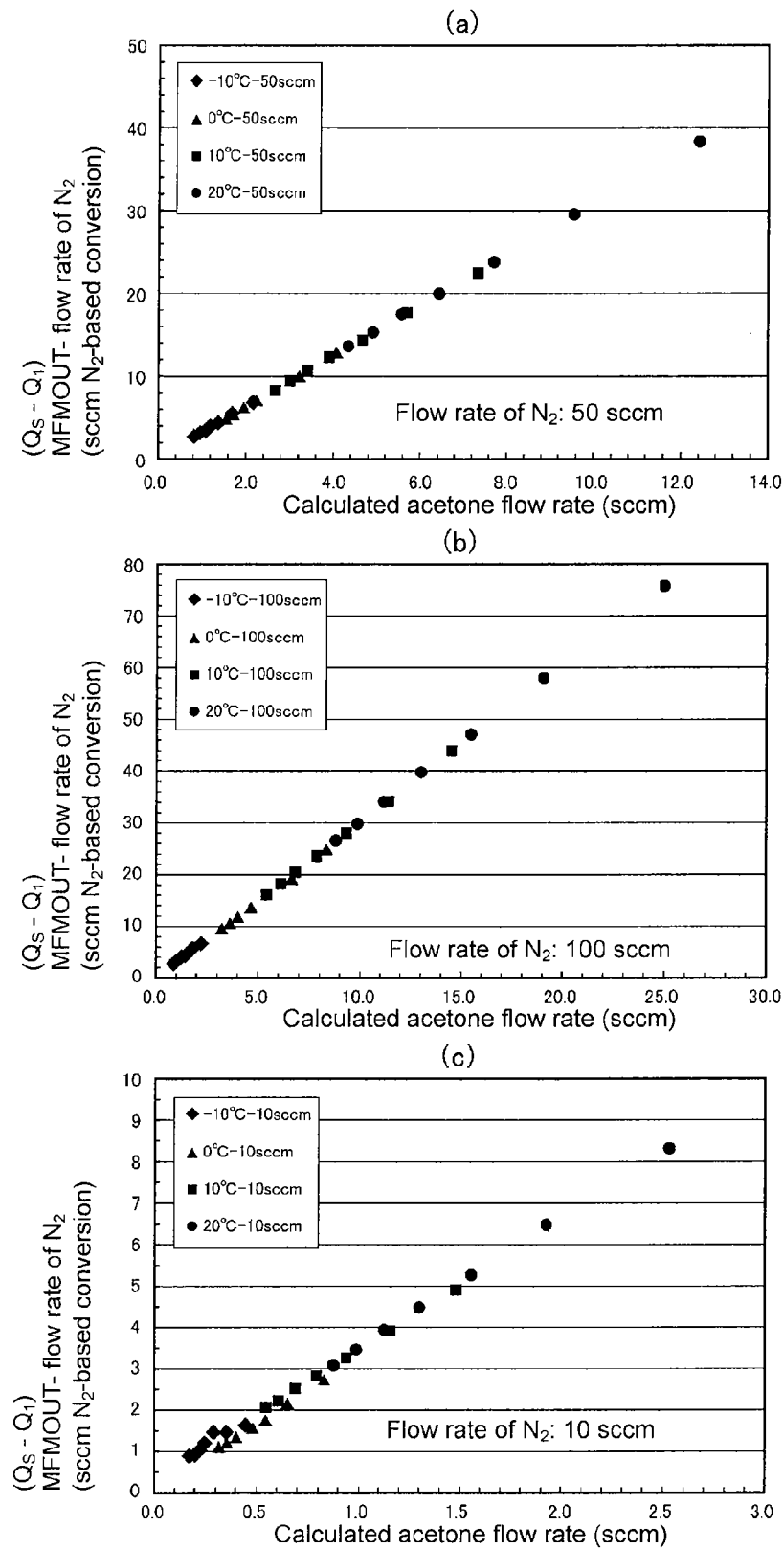
FIG. 4 is a line drawing which shows a relationship between a measurement value, with the carrier gas flow rate $Q_1$ kept constant (mixed gas flow rate $Q_S$–carrier gas flow rate $Q_1$) and the raw material gas flow rate $Q_2$ calculated with reference to Formula (2).

FIG. 4 is a drawing which shows a relationship of a difference between an $N_2$ converted detection flow rate $Q_S'$ of the mixed gas $G_S$ and the carrier gas flow rate $Q_1$, $Q_S'-Q_1$ which are measured by using a mass flow meter installed on the test equipment of FIG. 2, with a carrier gas flow rate ($Q_1$) kept constant and the tank temperature t (−10° C. to 20° C.) given as a parameter (that is, an $N_2$ converted raw material gas flow rate $Q_2'=Q_S'-Q_1$) with respect to an acetone flow rate ($Q_2$ sccm) calculated with reference to Formula (2). In this drawing, (a) covers a case where the carrier gas flow rate $Q_1$ is equal to 50 sccm, (b) covers a case where $Q_1$ is equal to 100 sccm and (c) covers a case where $Q_1$ is equal to 10 sccm.

As apparent from (a) to (c) in FIG. 4 as well, there is found a direct proportional relationship between a measurement value (mixed gas flow rate $Q_S'$-carrier gas flow rate $Q_1$) by using the mass flow meter and a calculated acetone flow rate $Q_2$. As a result, the carrier gas flow rate $Q_1$ is measured by using the mass flow controller 3 and the mixed gas flow rate $Q_S$ is measured by using the mass flow meter 9, respectively, to determine $Q_S-Q_1$. Thereby, it is possible to calculate the raw material gas flow rate $Q_2$.

Figure 5:
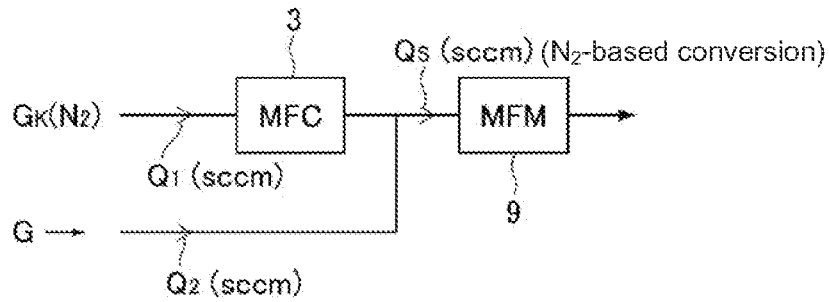
FIG. 5 is a schematic diagram which shows a system of supplying a raw material gas.
Figure 6:
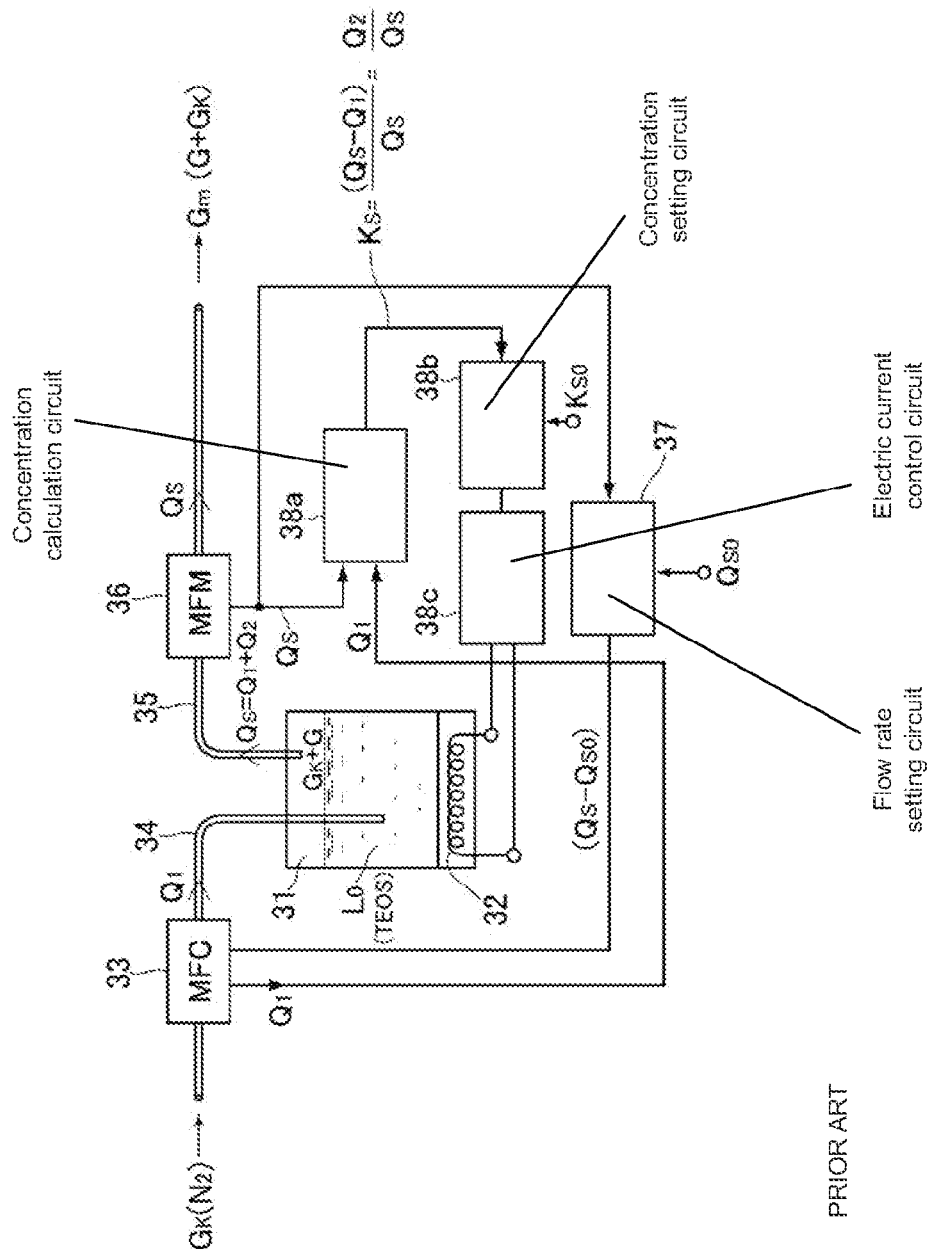
FIG. 6 is a drawing which describes one example of a conventional raw material vaporizing and supplying apparatus according to the bubbling method (Japanese Published Unexamined Patent Application Publication No. H07-118862).
Figure 7:
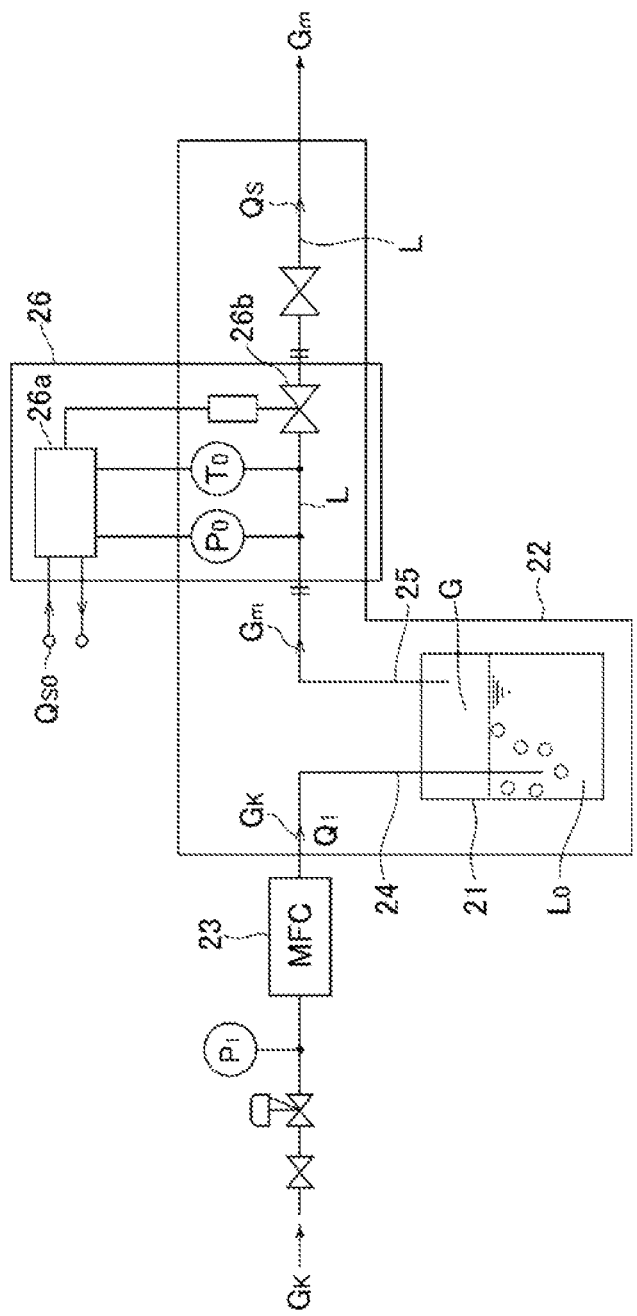
FIG. 7 is a drawing which describes another example of a conventional raw material vaporizing and supplying apparatus according to the bubbling method (Japanese Patent No. 4605790).

Next, a description will be given of calculation of a raw material gas flow rate $Q_2$ and a concentration K of the raw material gas G in the mixed gas Gs.

Where a raw material gas supply system is expressed as given in FIG. 5 and where a raw material gas G at a flow rate $Q_2$ equivalent to a concentration K and a carrier gas $G_K$ ($N_2$) at a flow rate $Q_1$ (that is, $Q_2+Q_1$ sccm) are supplied to the mass flow meter 9 to give a detection flow rate ($N_2$-based conversion) of mixed gas Gs at this time as $Q_S'$ (sccm), the raw material gas flow rate $Q_2$ and the raw material gas concentration K in the mixed gas can be obtained with reference to the formulae given below.

[Formula 3]

Raw material gas flow rate $Q_2$ (sccm)=CF of mixed gas×detected flow rate ($N_2$-based conversion) $Q_S'$ (sccm)−carrier gas flow rate $Q_1$ (sccm)  (3)

[Formula 4]

Raw material gas concentration K=Raw material gas flow rate $Q_2$ (sccm)/Carrier gas flow rate $Q_1$ (sccm)+Raw material gas flow rate $Q_2$ (sccm)  (4)

CF given in Formula (3) above is a conversion factor of the so-called mixed gas Gs in a thermal type mass flow meter and can be obtained with reference to Formula (5) below.

[Formula 5]

$1/CF = C/CF_A + (1-C)/CF_B$  (5)

However, in Formula (5), $CF_A$ denotes a conversion factor of gas A, $CF_B$ denotes a conversion factor of gas B, C denotes a volume ratio (concentration) of the gas A and (1−C) denotes a volume ratio (concentration) of the gas B ("Flow rate measurement: A to Z," compiled by the Japan Measuring Instruments Federation, published by Kogyogi-jutsusha (pp. 176 to 178)).

Now, in FIG. 5, where $CF_A$ of the carrier gas $G_K$ ($N_2$) is given as 1 and $CF_B$ of the raw material gas G is given as α, the concentration of the raw material gas is expressed as $Q_2/(Q_1+Q_2)$ and the concentration of the carrier gas is expressed as $Q_1/(Q_1+Q_2)$. Thus, CF of the mixed gas $Q_2$ is expressed by Formula (5) as follows.

$$\frac{1}{CF} = \frac{1}{1} \times \frac{Q_1}{Q_1+Q_2} + \frac{1}{\alpha} \cdot \frac{Q_2}{Q_1+Q_2} = \frac{\alpha Q_1 + Q_2}{\alpha(Q_1+Q_2)}$$ [Formula 6]

Thus, the following formula is obtained.

$$CF = \frac{\alpha(Q_1+Q_2)}{\alpha Q_1 + Q_2}$$ [Formula 7]

Therefore, the $N_2$ converted detection flow rate $Q_S'$ of the mixed gas $G_S$ detected by the mass flow meter 9 is expressed as follows.

$$Q_S' = \frac{Q_1 + Q_2}{CF}$$ [Formula 8]
$$= (Q_1+Q_2) \times (\alpha Q_1 + Q_2)/\alpha(Q_1+Q_2)$$
$$= (\alpha Q_1 + Q_2)/\alpha$$
$$= Q_1 + \frac{Q_2}{\alpha}$$

Thereby, the flow rate $Q_2$ of the raw material gas G is expressed as $Q_2=\alpha(Q_S'-Q_1)$. However, in this case, α is a conversion factor of the raw material gas G.

Table 3 below shows results obtained by comparing a raw material gas flow rate $Q_2$ calculated by using a conversion factor CF determined with reference to Formula (5) above with a raw material gas flow rate $Q_2$ computed by using Formula (1) and Formula (2). It is found that a value calculated with reference to Formula (1) and Formula (2) is well in agreement with a value calculated with reference to Formula (5).

It is noted that in Table 1, acetone is supplied as a raw material gas G and $N_2$ is supplied as a carrier gas $G_K$ at a flow rate $Q_1$=500 sccm and calculation is made, with the temperature t given as a parameter. The raw material gas flow rate $Q_2$ determined with reference to a pressure ratio between Formula (1) and Formula (2) and the raw material gas flow rate $Q_2$ determined with reference to a conversion factor CF according to Formula (5) are approximate in flow rate value with each other.

TABLE 3

| | | | CF of acetone: 0.341, Constant temperature water bath set at 20° C., Flow rate of $N_2$, 50 sccm | | | | | | |
|---|---|---|---|---|---|---|---|---|---|
| | RT | | ° C. | 24.0 | 24.0 | 23.9 | 23.9 | 24.0 | 24.1 | 23.9 |
| Tank temperature | | | ° C. | 19.2 | 19.4 | 19.3 | 19.3 | 19.4 | 19.5 | 19.4 |
| Acetone steam pressure | | | KPa abs | 23.9 | 24.0 | 24.0 | 23.9 | 24.1 | 24.1 | 24.0 |
| Flow rate of $N_2$ | | | sccm | 50.1 | 50.1 | 50.1 | 50.1 | 50.1 | 50.1 | 50.1 |
| Internal pressure of tank | | | KPa abs | 120 | 150 | 180 | 210 | 240 | 270 | 300 |
| Concentration | | | % | 19.9% | 16.0% | 13.3% | 11.4% | 10.0% | 8.39% | 8.0% |
| Detection flow rate of mixed gas $G_s$ ($N_2$-based conversion): $Q_s'$ | AVE | sccm | 88.4 | 79.6 | 73.9 | 70.2 | 67.6 | 65.4 | 63.8 |
| | MAX | sccm | 89.1 | 80.2 | 74.7 | 70.7 | 68.2 | 66.0 | 64.4 |
| | MIN | sccm | 87.8 | 78.9 | 73.2 | 69.6 | 67.1 | 64.9 | 63.3 |
| Raw material gas flow rate ($N_2$-based conversion) $Q_2'$ | | sccm | 38.3 | 29.5 | 23.8 | 20.1 | 17.5 | 15.3 | 13.7 |
| Calculated acetone flow rate (Formula 2) | | sccm | 12.43 | 9.56 | 7.70 | 6.44 | 5.59 | 4.92 | 4.32 |
| Mixed gas CF | | — | 0.869 | 0.894 | 0.912 | 0.925 | 0.934 | 0.941 | 0.947 |
| Measured acetone flow rate (Formula 5) | | sccm | 13.08 | 10.05 | 8.13 | 6.86 | 5.98 | 5.23 | 4.68 |

Table 4, Table 5 and Table 6 below respectively show cases in which an acetone flow rate determined by using a pressure ratio (Formula (1) and Formula (2)) is compared with an acetone flow rate determined by using a conversion factor CF (Formula 5), with a flow rate $Q_1$ of $N_2$ as a carrier gas $G_K$ being changed.

TABLE 4

Flow rate of $N_2$: 100 sccm

| | | Internal pressure $P_0$ of tank | | | | | | |
|---|---|---|---|---|---|---|---|---|
| | kPaabs | 120 | 150 | 180 | 210 | 240 | 270 | 300 |
| | | 100 sccm 20° C. | | | | | | |
| Partial pressure acetone flow rate | sccm | 24.99 | 19.06 | 15.46 | 13.00 | 11.19 | 9.83 | 8.76 |
| CF acetone flow rate | sccm | 25.91 | 19.83 | 16.06 | 13.60 | 11.63 | 10.22 | 9.10 |
| | | 100 sccm 10° C. | | | | | | |
| Partial pressure acetone flow rate | sccm | 14.46 | 11.34 | 9.30 | 7.87 | 6.80 | 6.03 | 5.37 |
| CF acetone flow rate | sccm | 14.99 | 11.67 | 9.55 | 8.08 | 6.98 | 6.18 | 5.55 |
| | | 100 sccm 0° C. | | | | | | |
| Partial pressure acetone flow rate | sccm | 8.30 | 6.61 | 5.38 | 4.62 | 4.01 | 3.59 | 3.21 |
| CF acetone flow rate | sccm | 8.42 | 6.64 | 5.48 | 4.64 | 4.02 | 3.59 | 3.25 |
| | | 100 sccm −10° C. | | | | | | |
| Partial pressure acetone flow rate | sccm | 4.36 | 3.46 | 2.84 | 2.43 | 2.12 | 1.88 | 1.70 |
| CF acetone flow rate | sccm | 4.37 | 3.43 | 2.80 | 2.42 | 2.06 | 1.87 | 1.67 |

TABLE 5

Flow rate of $N_2$: 50 sccm

| | | Internal pressure $P_0$ of tank | | | | | | |
|---|---|---|---|---|---|---|---|---|
| | kPaabs | 120 | 150 | 180 | 210 | 240 | 270 | 300 |
| | | 50 sccm 20° C. | | | | | | |
| Partial pressure acetone flow rate | sccm | 12.43 | 9.56 | 7.70 | 6.44 | 5.59 | 4.92 | 4.36 |
| CF acetone flow rate | sccm | 13.08 | 10.05 | 8.13 | 6.86 | 5.98 | 5.23 | 4.68 |
| | | 50 sccm 10° C. | | | | | | |
| Partial pressure acetone flow rate | sccm | 7.34 | 5.68 | 4.67 | 3.94 | 3.42 | 3.02 | 2.69 |
| CF acetone flow rate | sccm | 7.69 | 6.01 | 4.93 | 4.18 | 3.64 | 3.24 | 2.88 |
| | | 50 sccm 0° C. | | | | | | |
| Partial pressure acetone flow rate | sccm | 4.12 | 3.25 | 2.67 | 2.27 | 1.99 | 1.77 | 1.57 |
| CF acetone flow rate | sccm | 4.39 | 3.43 | 2.83 | 2.42 | 2.12 | 1.86 | 1.69 |
| | | 50 sccm −10° C. | | | | | | |
| Partial pressure acetone flow rate | sccm | 2.21 | 1.74 | 1.44 | 1.23 | 1.08 | 0.96 | 0.86 |
| CF acetone flowrate | sccm | 2.35 | 1.91 | 1.53 | 1.33 | 1.17 | 1.08 | 0.94 |

TABLE 6

Flow rate of $N_2$: 10 sccm

| | | Internal pressure $P_0$ of tank | | | | | | |
|---|---|---|---|---|---|---|---|---|
| | kPaabs | 120 | 150 | 180 | 210 | 240 | 270 | 300 |
| | | 10 sccm 20° C. | | | | | | |
| Partial pressure acetone flow rate | sccm | 2.53 | 1.93 | 1.56 | 1.30 | 1.13 | 0.99 | 0.88 |
| CF acetone flow rate | sccm | 2.84 | 2.21 | 1.80 | 1.53 | 1.35 | 1.18 | 1.05 |
| | | 10 sccm 10° C. | | | | | | |
| Partial pressure acetone flow rate | sccm | 1.48 | 1.16 | 0.94 | 0.80 | 0.69 | 0.61 | 0.54 |
| CF acetone flow rate | sccm | 1.68 | 1.34 | 1.11 | 0.96 | 0.86 | 0.76 | 0.70 |
| | | 10 sccm 0° C. | | | | | | |
| Partial pressure acetone flow rate | sccm | 0.83 | 0.65 | 0.54 | 0.48 | 0.40 | 0.35 | 0.32 |
| CF acetone flow rate | sccm | 0.93 | 0.73 | 0.60 | 0.54 | 0.46 | 0.42 | 0.38 |
| | | 10 sccm −10° C. | | | | | | |
| Partial pressure acetone flow rate | sccm | 0.45 | 0.35 | 0.29 | 0.25 | 0.22 | 0.19 | 0.17 |
| CF acetone flow rate | sccm | 0.55 | 0.50 | 0.50 | 0.41 | 0.34 | 0.30 | 0.30 |

As apparent from the above description as well, where a partial pressure method based on Formula (1) and Formula (2) is used to determine a raw material gas steam flow rate $Q_2$ and a raw material gas steam concentration K, as a matter of course, a steam pressure curve of raw material (a relationship between the temperature t and steam pressure $P_{M0}$) is required, in addition to a measured flow rate value $Q_1$ from the mass flow controller 3, a measurement value of internal pressure $P_0$ of the tank from the automatic pressure regulating device 8 and a measured flow rate $Q_S'$ from the mass flow meter 9 as shown in FIG. 1. Further, the raw material concentration arithmetic unit 10 shown in FIG. 1 is required to store in advance a curve which covers the temperature t of the raw material 4 and the steam $P_{M0}$.

Further, also in a case where a CF method according to Formula (5) is used to determine a raw material gas flow rate $Q_2$ and a raw material gas steam concentration K, it is desirable that conversion factors CFs for various types of raw material gas and various types of mixed gas $G_S$ are in advance prepared in a table form.

As a matter of course, the raw material gas steam flow rate $Q_2$ and the raw material gas steam concentration K which have been described previously are all computed and displayed, etc., on the raw material concentration arithmetic unit 10 shown in FIG. 1 by using a CPU, etc.

Further, as a matter of course, the raw material gas steam concentration K can be raised or lowered by controlling a tank pressure $P_0$ and/or a tank temperature t.

INDUSTRIAL APPLICABILITY

The present invention is applicable not only to a raw material vaporizing and supplying apparatus used in a MOCVD method and a CVD method but also applicable to any liquid supplying apparatus arranged so as to supply gas from a pressurized storage source to a process chamber in plants for manufacturing semiconductors and chemicals.

DESCRIPTION OF REFERENCE SYMBOLS

1: carrier gas supply source
2: decompression unit
3: mass flow control system
3a: sensor unit of mass flow controller
3b: flow rate arithmetic and control unit of mass flow controller
3e: flow rate display signal
4: raw material (MO material such as organometallic compound)
5: source tank (container)
6: constant temperature unit
7: induction pipe
8: automatic pressure regulating device in source tank
8a: control valve
8b: pressure arithmetic and control unit
8c: pressure detection signal
8d: control valve control signal
8e: pressure display signal
8f: temperature detection signal
9: mass flow meter
9a: sensor unit of mass flow meter
9b: arithmetic and control unit of mass flow meter
9c: mixed gas flow rate detection signal
9e: display signal of mixed gas flow rate
10: raw material concentration arithmetic unit
$10_K$: concentration detection signal
CF: conversion factor of mixed gas
$CF_A$: conversion factor of gas A
$CF_B$: conversion factor of gas B
C: volume ratio of gas A
$G_K$: carrier gas
G: raw material gas
$G_S$: mixed gas
$P_0$: internal pressure of source tank
$P_{M0}$: raw material steam partial pressure in source tank
$Q_1$: carrier gas flow rate
$Q_S$: mixed gas flow rate
$Q_S'$: detection flow rate of mass flow meter ($N_2$-based conversion)
$Q_2$: raw material gas flow rate
$Q_2'$: raw material gas flow rate ($N_2$-based conversion)
K: raw material gas steam concentration
P: pressure gauge
T: temperature gauge
t: tank temperature (raw material temperature)

What is claimed is:

1. A raw material vaporizing and supplying apparatus comprising:
a raw material concentration detection mechanism, an automatic pressure regulating device, a mass flow meter, a flow-out passage, a source tank, and a constant temperature unit,
wherein the raw material vaporizing and supplying apparatus is operably arranged to supply a carrier gas $G_K$ into the source tank through a mass flow controller to release the carrier gas $G_K$ from inside the source tank and also to supply into a process chamber a mixed gas $G_S$ composed of the carrier gas $G_K$ and saturated vapor G of a raw material produced by keeping the source tank at a constant temperature with the constant temperature unit;
wherein the automatic pressure regulating device and the mass flow meter are installed on the flow-out passage of the mixed gas $G_S$ from the source tank, the automatic pressure regulating device is controlled so as to open and close a control valve, thereby controlling an internal pressure $P_0$ of the source tank to a predetermined value,
wherein individual detection values of a flow rate $Q_1$ of the carrier gas $G_K$ by the mass flow controller, the internal pressure $P_0$ of the tank, and a flow rate $Q_S$ of the mixed gas $G_s$ by the mass flow meter are input into a raw material concentration arithmetic unit, the raw material concentration arithmetic unit is used to compute a raw material flow rate $Q_2$ based on $Q_2=(Q_S \times P_{M0})/P_0$, and a raw material concentration K of the mixed gas $G_S$ supplied to the process chamber is computed and displayed in terms of $K=Q_2/Q_S$ with reference to the raw material flow rate $Q_2$, wherein $P_{M0}$ is a saturated vapor pressure of raw material vapor G at a temperature of t° C. in the source tank.

2. The raw material vaporizing and supplying apparatus according to claim 1, wherein a storage device of saturated steam pressure data of the raw material in the source tank is installed on the raw material concentration arithmetic unit and also detection signals of the internal pressure $P_0$ of the source tank and a temperature t from the automatic pressure regulating device are input into the raw material concentration arithmetic unit.

3. The raw material vaporizing and supplying apparatus according to claim 1, wherein the raw material concentration detection unit, a flow rate arithmetic and control unit of the mass flow controller, a pressure arithmetic and control unit of the automatic control device and a flow rate arithmetic and control unit of the mass flow meter are arranged so as to be assembled in an integrated manner.

4. The raw material vaporizing and supplying apparatus according to claim 1, wherein the mass flow meter is installed on the downstream side of the automatic pressure regulating device.

5. The raw material vaporizing and supplying apparatus according to claim 1, wherein the mass flow meter is installed on the upstream side of the regulating device.

6. The raw material vaporizing and supplying apparatus according to claim 1, wherein the automatic pressure regulating device is a pressure regulating device which has a temperature detector T, a pressure detector P, a control valve installed on the downstream side from the pressure detector P and a pressure arithmetic and control unit.

7. The raw material vaporizing and supplying apparatus according to claim 6, wherein the mass flow meter is installed between the pressure detector P and the control valve.

8. A raw material vaporizing and supplying apparatus comprising:
a raw material concentration detection mechanism, an automatic pressure regulating device, a mass flow meter, a flow-out passage, a source tank, and a constant temperature unit,
wherein the raw material vaporizing and supply apparatus is connected to supply a carrier gas $G_K$ into a source tank through a mass flow controller to release the carrier gas $G_K$ from inside the source tank and also to supply, into a process chamber, a mixed gas $G_S$ composed of the carrier gas $G_K$ and saturated vapor G of a raw material produced by keeping the source tank at a constant temperature with the constant temperature unit;
wherein the automatic pressure regulating device and the mass flow meter are installed on the flow-out passage of the mixed gas $G_S$ from the source tank, the automatic pressure regulating device is controlled so as to open and close a control valve, thereby controlling an internal pressure $P_0$ of the source tank to a predetermined value,
wherein detection values of a flow rate $Q_1$ of the carrier gas $G_K$ by the mass flow controller, the internal pressure $P_0$ of the tank and a flow rate $Q_S$ of the mixed gas $G_S$ from the mass flow meter are input into a raw material concentration arithmetic unit, and the raw material concentration arithmetic unit is used to determine a raw material flow rate $Q_2$ based on $Q_2=(CF \times Q_S')-Q_1$, and a raw material concentration K of the mixed gas $G_S$ supplied to the process chamber is computed and displayed in terms of $K = Q_2/(Q_1+Q_2)$ with reference to the raw material flow rate $Q_2$, wherein CF is a conversion factor of the mixed gas $Q_2$.

9. The raw material vaporizing and supplying apparatus according to claim 8, wherein a conversion factor CF of the mixed gas $Q_2$ is $1/CF=C/CF_A+(1-C)/CF_B$ wherein, $CF_A$ is a conversion factor of the carrier gas $G_K$, $CF_B$ is a conversion factor of the raw material gas G and C is a volume ratio of the carrier gas, namely, $Q_1/(Q_1+Q_2)$.

10. The raw material vaporizing and supplying apparatus according to claim 8, wherein the raw material concentration arithmetic unit is provided with a storage device of individual data on conversion factors of the raw material gas G in the source tank and conversion factors of the carrier gas $G_K$.

11. The raw material vaporizing and supplying apparatus according to claim 8, wherein the raw material concentration detection unit, a flow rate arithmetic and control unit of the mass flow controller, a pressure arithmetic and control unit of the automatic control device and a flow rate arithmetic and control unit of the mass flow meter are arranged so as to be assembled in an integrated manner.

12. The raw material vaporizing and supplying apparatus according to claim 8, wherein the mass flow meter is installed on the downstream side of the automatic pressure regulating device.

13. The raw material vaporizing and supplying apparatus according to claim 8, wherein the mass flow meter is installed on the upstream side of the regulating device.

14. The raw material vaporizing and supplying apparatus according to claim 8, wherein the automatic pressure regulating device is a pressure regulating device which has a temperature detector T, a pressure detector P, a control valve installed on the downstream side from the pressure detector P and a pressure arithmetic and control unit.

15. A raw material vaporizing and supplying apparatus, comprising:
a source tank for containing source material;
a constant temperature unit disposed to keep the source tank at a constant temperature t° C.;
a source of carrier gas $G_K$;
a mass flow controller disposed to control a flow of carrier gas $G_K$ from the source of carrier gas $G_K$ into the source tank at a flow rate $Q_1$;
an outflow passage disposed to deliver a mixed gas $G_S$, composed of the carrier gas $G_K$ and a saturated vapor G of a raw material, from the source tank at a flow rate $Q_S$;
a raw material concentration detection mechanism;
a control valve disposed to control the internal pressure $P_0$ of the source tank;
an automatic pressure regulating device disposed and arranged to regulate the internal pressure $P_0$ of the source tank to a predetermined value;
a mass flow meter disposed in the outflow passage to measure flow rate $Q_s$ of mixed gas $G_S$;
a process chamber disposed to receive mixed gas $G_S$ composed of the carrier gas $G_K$ and the saturated vapor G of the raw material from said outflow passage;
a raw material concentration arithmetic unit, configured to receive data and compute (a) a raw material flow rate $Q_2$ based on $Q_2=(Q_S \times P_{M0})/P_0$, wherein $P_{M0}$ is a saturated vapor pressure of raw material vapor G at a temperature of t° C. in the source tank, and (b) a raw material concentration K of the mixed gas $G_S$ supplied to the process chamber of $K=Q_2/Q_S$ with reference to the raw material flow rate $Q_2$.

16. A raw material vaporizing and supplying apparatus, comprising:
a source tank for containing source material;
a constant temperature unit disposed to keep the source tank at a constant temperature t° C.;
a source of carrier gas $G_K$;
a mass flow controller disposed to control a flow of carrier gas $G_K$ from the source of carrier gas $G_K$ into the source tank at a flow rate $Q_1$;
an outflow passage disposed to deliver a mixed gas $G_S$, composed of the carrier gas $G_K$ and a saturated vapor G of a raw material, from the source tank at a flow rate $Q_S$;
a raw material concentration detection mechanism;
a control valve disposed to control the internal pressure $P_0$ of the source tank;
an automatic pressure regulating device disposed and arranged to regulate the internal pressure $P_0$ of the source tank to a predetermined value;
a mass flow meter disposed in the outflow passage to measure flow rate $Q_S$ of mixed gas $G_S$;
a process chamber disposed to receive mixed gas $G_s$ composed of the carrier gas $G_K$ and the saturated vapor G of the raw material from said outflow passage;
a raw material concentration arithmetic unit, configured to receive data and compute (a) a raw material flow rate $Q_2$ based on $Q_2=(CF \times Q_S')-Q_1$, wherein CF is a conversion factor of the mixed gas $Q_2$, and (b) a raw material concentration K of the mixed gas $G_S$ supplied to the process chamber based on $K=Q_2/(Q_1+Q_2)$ with reference to the raw material flow rate $Q_2$.

* * * * *